(12) United States Patent
Corbett (10) Patent No.: US 7,087,448 B2
(45) Date of Patent: Aug. 8, 2006

(54) SINGLE FREQUENCY LASER

(75) Inventor: Brian Michael Corbett, Douglas (IE)

(73) Assignee: University of Ireland, Cork, Cork (IE)

( * ) Notice: Subject to any disclaimer, the term of this patent is extended or adjusted under 35 U.S.C. 154(b) by 114 days.

(21) Appl. No.: 10/399,070

(22) PCT Filed: Oct. 11, 2001

(86) PCT No.: PCT/IE01/00128

§ 371 (c)(1),
(2), (4) Date: Apr. 10, 2003

(87) PCT Pub. No.: WO02/31863

PCT Pub. Date: Apr. 18, 2002

(65) Prior Publication Data

US 2004/0113164 A1    Jun. 17, 2004

(30) Foreign Application Priority Data

Oct. 11, 2000   (IE)   ............................... S2000/0820

(51) Int. Cl.
*H01L 21/00*   (2006.01)
(52) U.S. Cl. ........................... 438/31; 438/16; 438/39; 385/1; 385/12; 385/44; 385/142

(58) Field of Classification Search ................. 372/43, 372/48, 50, 54, 64; 438/16, 31; 385/1, 12, 385/142
See application file for complete search history.

(56) References Cited

U.S. PATENT DOCUMENTS 5,780,320 A * 7/1998 Kinoshita ..................... 438/33
5,917,972 A * 6/1999 Davies ........................ 385/43

* cited by examiner

*Primary Examiner*—Long Pham
*Assistant Examiner*—Wai-Sing Louie
(74) *Attorney, Agent, or Firm*—Gordon & Rees LLP (57) ABSTRACT

This invention relates to generally to semiconductor devices, for example lasers and more particularly to single frequency lasers and is directed at overcoming problems associated with the manufacture of these devices. In particular, a laser device is provided formed on a substrate having a plurality of layers (1,2,3,4,5), the laser device comprising at least one waveguide (for example a ridge) established by the selective removal of sections of at least one of the layers. The ridge (100;101) has at least one defect defining region (104), the at least one defect defining region of the ridge defining a defect in the ridge. The width of the ridge is greater in the at least one defect defining region of the ridge than in adjacent sections of the ridge.

19 Claims, 11 Drawing Sheets

Electron Beam Lithography

Mask

Resist

Optical Lithography

Mask —80

Resist 82

Figure 15

SINGLE FREQUENCY LASER

FIELD OF THE INVENTION

The invention relates generally to semiconductor devices, in particular waveguides, for example lasers and more particularly to single frequency lasers and a method, production layout or mask for the manufacture of same.

BACKGROUND TO THE INVENTION

Semiconductor waveguides, for example lasers or laser diodes are well known in the art with many applications in data communications, telecommunications, metrology and sensing. The most common method in achieving single frequency operation in a semiconductor laser is by etching a grating layer into the semiconductor and burying that grating layer using epitaxial overgrowth. As the grating pitch is of the order of the wavelength/refractive index, either holographic or electron beam techniques are required for their definition. In addition in many cases the added complexity of material overgrowth makes those common techniques expensive.

One of the simpler and more reliable laser devices available is the self aligned ridge laser. Such a device is described in U.S. Pat. No. 5,059,552.

Figure 1:
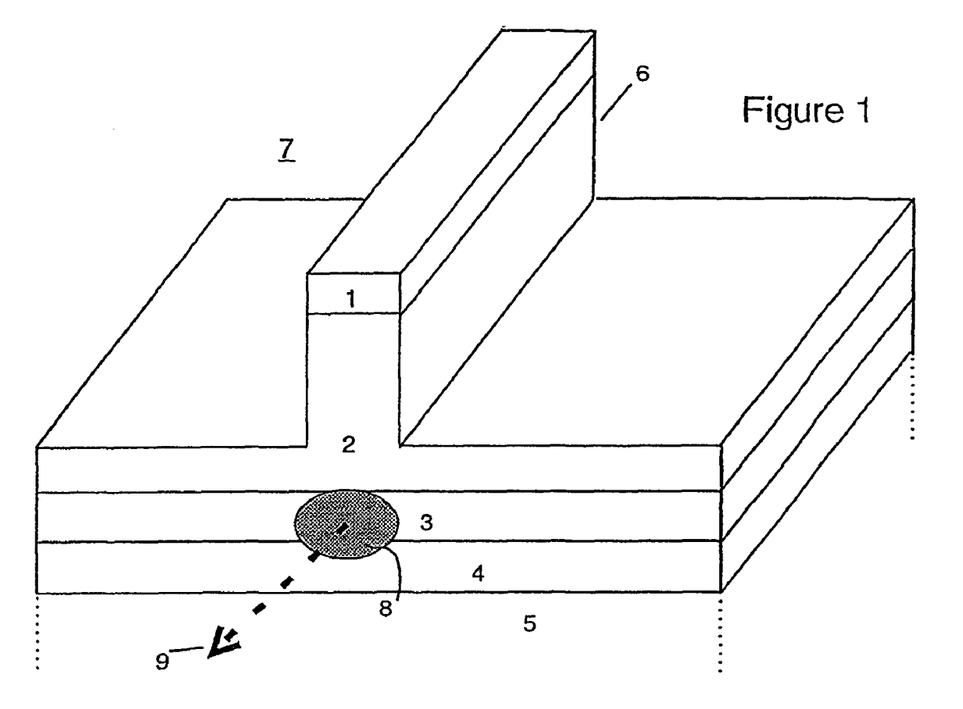
FIG. 1 is a schematic of a conventional prior art ridge laser structure.
Figure 2:
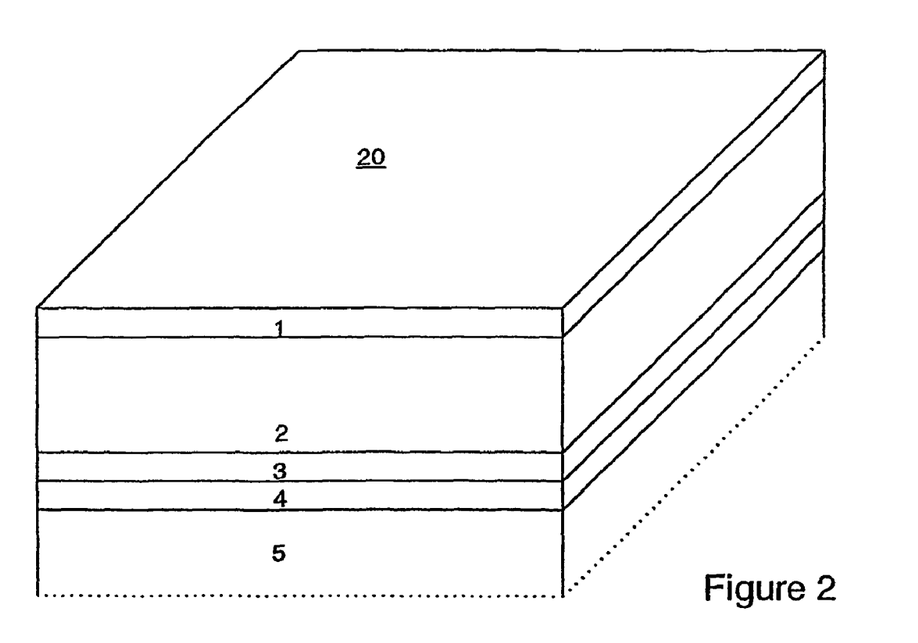
FIG. 2 is a schematic showing a section of semiconductor body from which, an optoelectronic device, for example a ridge laser may be constructed.

FIG. 1 illustrates a typical example of a "ridge" laser or lasing device 7. The representation of a finished ridge laser device is a simplified version for the purposes of explanation. In operation, light 9 is primarily emitted from shaded region 8. The formation of a "ridge" 6 is effected by etching into a layered material, as shown in FIG. 2, comprising a series of at least four epitaxial layers 1, 2, 3, 4 formed on a semiconductor substrate 5. For a n-type substrate 5, the top layer 1 which is the contact layer comprises p-type material, the second layer 2 is a cladding layer and also comprises p-type material. The third layer 3 typically comprises a number of undoped active layers which are used for light guiding and gain purposes and may be composed of bulk, quantum well or quantum dots. The fourth layer 4 is an n-type cladding layer. It will also be understood that suitable etch stopping layers may also be incorporated into the structure 20. As with other semiconductor devices, typically a large number of ridge lasers are formed on a single semiconductor wafer and subsequently divided. Accordingly, the structures illustrated should be taken as only a part of a larger semiconductor body.

For the case of a InP laser emitting in the 1.2–2.0 μm wavelength range, the epitaxial top layer 1 is typically InGaAs, with the second and fourth layers and the substrate typically InP, with layer 3 typically containing InGaAsP and/or InGaAlAs. Other material combinations are also possible. It will also be appreciated that alternative semiconductor materials, e.g. those based on GaAs, GaSb, or GaN would incorporate different epitaxial layers and could require alternative etchants.

Figure 3:
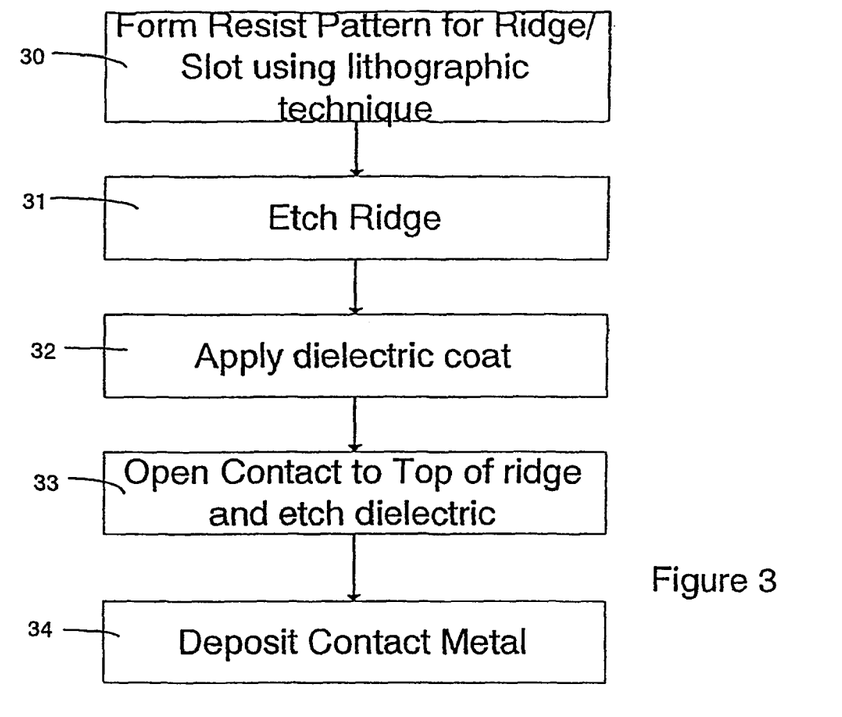
FIG. 3 is a flowchart illustrating the steps in the process of manufacturing a conventional ridge laser of the type shown in FIG. 1 from the semiconductor body of FIG. 2.
Figure 4:
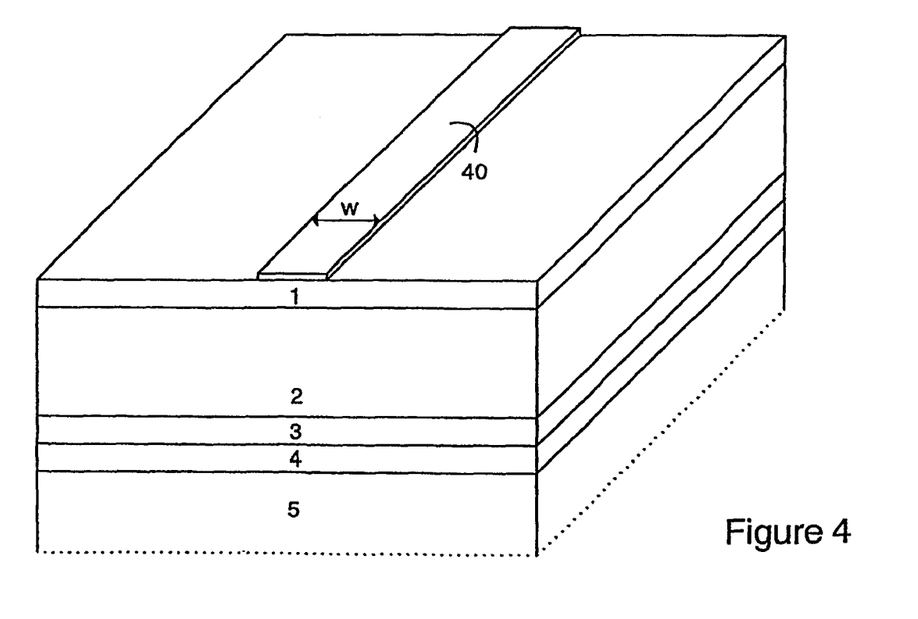
FIG. 4 is a schematic showing the semiconductor body of FIG. 2 having an applied layer of resist pattern.

The process of manufacturing a "ridge" laser, as illustrated in simplified form in FIG. 3, commences with the formation (30) of the outline of the ridge in a layer of resist material 40, as shown in FIG. 4, on the top layer 1, using a suitable lithographic technique. The shape of the resist material is determined by the mask used in the lithographic process. The subsequent outline of the ridge formed will be determined by the outline of the mask.

Figure 5:
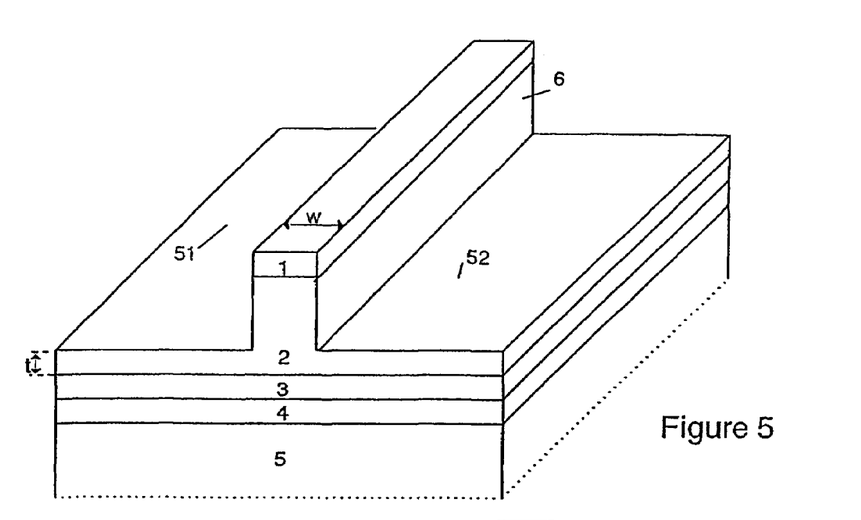
FIG. 5 is a schematic showing the structure of FIG. 4 after an etching process has been performed, FIG. 6 (a–c) represents profile views of the structure of FIG. 4 and demonstrate the final steps in the manufacturing process for a ridge laser.

The next step in the process is to etch 31 the structure to remove the top layer and part of the second layer in regions not covered by the resist material. The thickness (t) of the remaining portion of layer 2 in the region which has been etched 51, 52 contributes to the characteristics of the finished "ridge" laser. In regions covered by the resist material, the top layer and second layer are substantially unaffected by the etching process, thus leaving a raised surface or "ridge" effectively matching the mask outline. The width of the ridge (w) formed matches that of the outline formed by the resist material 40.

Single spatial mode output is essential for many applications and is typically obtained by an appropriate choice of ridge width (w) and etch depth, or more correctly the remaining thickness (t). Typically, imposing a ridge width (w) in the range of 2–4 μm while t is of the order of 0.1–0.5 μm. Achieving this single mode is an objective of the 'ridge' and is relatively easily obtainable using conventional techniques.

Figure 6A:
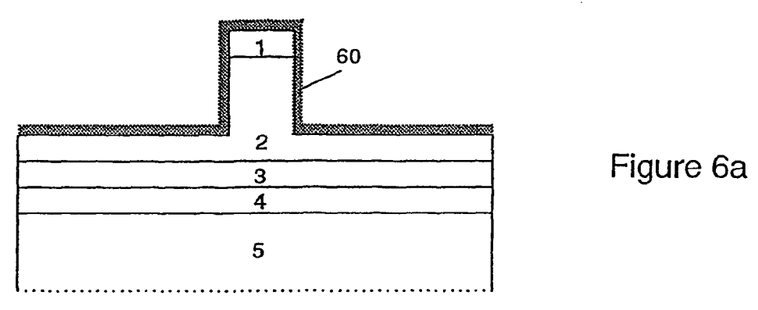
Figure 6B:
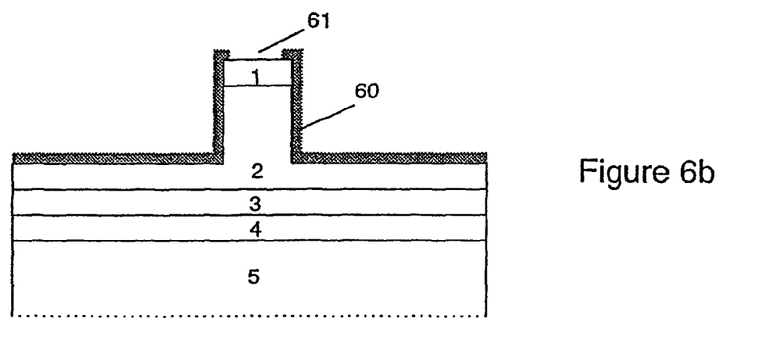
Figure 6C:
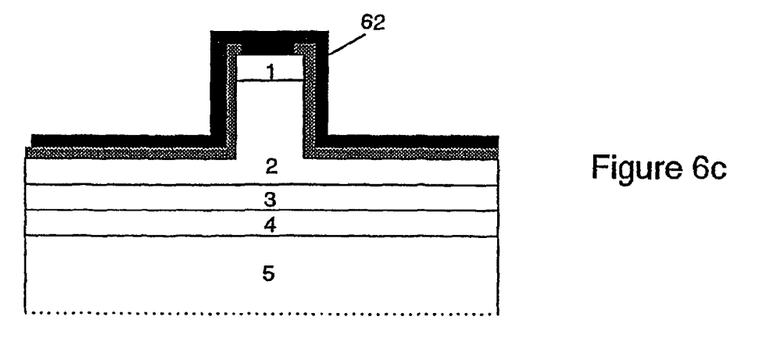

The third step 32 in the process is to apply a dielectric coating 60 over the structure, as shown in FIG. 6a. The next step 33 involves removing a portion 61 of the dielectric material 60 covering the top surface of the ridge, as illustrated in FIG. 6b, using a conventional etching technique. The final step 34 is to apply a metal contact layer 62 on the portion of the ridge 6 not covered by the dielectric material to form a metal contact 62, as shown in FIG. 6c. Other steps not shown include an alloy and thinning of the substrate to approximately 100–120 μm, a further metal coating step to apply a metal contact layer to the substrate with subsequent alloy, a cleaving step in which the ridge laser is cleaved at a particular point to define its end, and the breaking up of the wafer into individual ridge laser devices.

Although such "ridge" laser devices are reliable, there is a tendency of such structures to operate with multi-longitudinal modes. The work of DiChiaro [L. DeChiaro, *J. Lightwave Technology*, Vol 8 Nov. 1990 pp 1659–1669, *J. Lightwave Technology*, Vol 9 Aug. 1991 pp 975–986] showed that the introduction of a defect at a fractional position of the cavity length could convert multi-longitudinal modes into a single longitudinal mode. This method is however rather crude and introduces damage into the laser. Further to this, Patterson et al and Kozlowski et al [B. D. Patterson et al, *Microelectronic Engineering*, Vol 27 1995, pp 347–350, D. A. Kozlowski et al, *Electon. Letters*, Vol 31, April 1995, pp 648–650] used focused ion beam etching to create a series of holes along the length of a laser cavity. Kozlowski monitored the spectrum of the laser during this process, and showed that the etching allowed for an improved spectral performance (Side Mode Suppression Ratio—SMSR) through the enhancement of the effect by several 'defects' acting together. However, this work was on fully processed lasers, i.e. post laser fabrication, and has limited commercial application. Further work by the present inventor [B. Corbeft and D. McDonald, *Electron Letters*, Vol 31, December 1995, pp 2181–2182] showed that the integration of the defect could be incorporated into the standard process sequence for ridge waveguide lasers.

Figure 7:
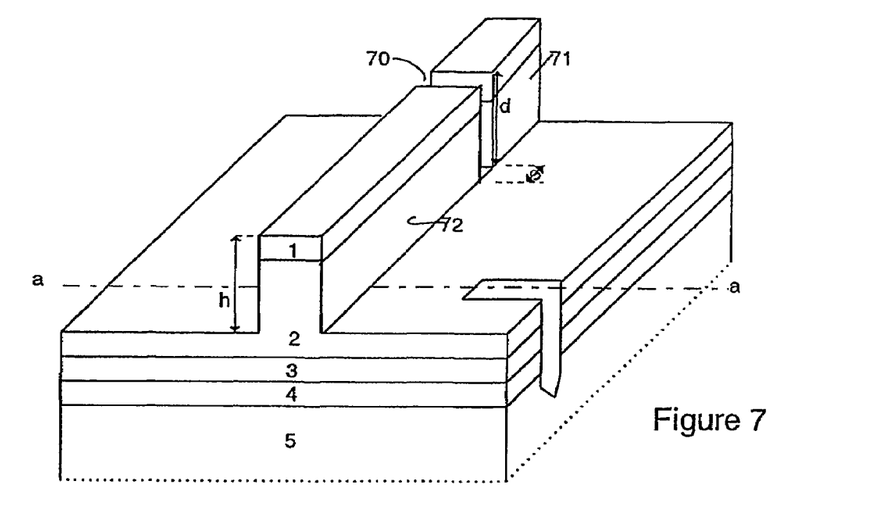
FIG. 7 shows a pictorial view of a further example of a prior art ridge laser device.

The integration of a suitable defect may be incorporated using electron beam lithography by the placement of a gap in the mask forming the ridge, thus resulting in an omission of a section of resist material. Accordingly, the etching process forms a slot 70 between two sections 71, 72 of the ridge as shown in FIG. 7. More than one slot may be required to achieve a desired characteristic in each ridge laser device. An implementation, as published by the present inventor [supra], having a slot width "s" of 0.5–1.0 μm allows for accurate reproduction using electron beam lithography. The width of the slot "s" is determined by the gap width in the mask forming the ridge. The etch depth (d) of the slot is the same for both the spatial mode and the longitudinal mode, resulting from the processing of both ridge and slot in the same process step, i.e. the depth (d) of the slot 70 equals the height (h) of the ridge. It will be noted that the slot formed is dimensionally along the longitudinal axis of the ridge.

Electron beam lithography is a ultra-high definition direct-write lithographic process where is accomplished by omitting to write (or in some processes writing) a pattern of electrons onto a resist layer.

Conventionally, the length of the ridge and accordingly the length of the laser are defined by marking the edge of the processed material with a diamond scribe perpendicular to the ridge. Increasing sophistication of tools now permits an absolute marking accuracy of a few microns with relative marking accuracy less than 1 μm. However, in order to have accurate absolute markings with respect to the slot location, a special cleave feature is defined lithographically. This is achieved using a non-selective dry etch through the active layers and a special crystallographic wet etch that ends in a sharp line; this being the intersection between two crystal planes, as shown in FIG. 7. The edge then serves as the location of the cleave plane and hence the end of the laser (referred to as the facet). For example, in FIG. 7 the ridge laser device would have its end defined by the line a—a after the cleaving process. The appropriate wet etchant for InP substrate is HCl. Again, it will be appreciated that the etchants described hereinbefore are specific to an InP substrate and that alternative substrates such as GaAs may require different etchant materials. The registration of the slot with respect to the cavity length is obtained by the high resolution of the direct write electron beam lithography system. The cleave feature is formed in a separate process to the formation of the ridge and slots.

As detailed above, this existing technique is implemented using direct write electron beam lithography, which is highly accurate in its definition of features and in referencing between lithographic levels. However, use of this technique is slow, expensive and does not deliver sufficient cost benefit to be favoured over alternative techniques for single frequency lasers such as Distributed Feedback (DFB) devices. Due to the large costs associated with purchasing and running direct electron beam lithographic equipment, it will be appreciated that it is not commercially feasible to use such equipment for production purposes. To be commercially viable the process needs to be implemented with more cost efficient techniques such as optical lithography. In the present application, the use of the word optical is intended to include any lithographical process using the projection of a resist modifying flux through suitable masking apertures, and includes the use of visible list, deep UV, or scattering electron beam lithography. The use of optical lithography has, however, associated shortcomings such as resolution and alignment accuracy. In particular, to the resolution requirement to define, for example, a ridge of width of the order of 3 μm, having a slot with a gap of the order of 0.5 μm, is not obtainable using conventional optical lithographic techniques.

Figure 8:
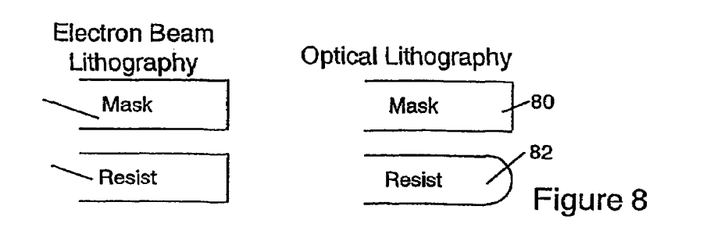
FIG. 8 is a pictorial representation of masks and resulting resist patterns.

Using optical lithography to produce a ridge outline having a gap in the resist layer is ineffective. The resist pattern 82 becomes rounded in regions corresponding to the corner regions of the mask 80 and leads to an ill-defined resist surface pattern compared to the results 81 achieved using direct write electron beam lithography, as shown in FIG. 8. This rounding of corners in resist patterns as reproduced on a ridge subsequently by etching, results in a general degradation in the single frequency performance of the resulting "ridge" laser. If poor contact is made between the mask and the imaging resist during pattern transfer the resultant degradation in corners can be more severe due to diffraction, which results in further degradation in the single frequency performance of the laser device.

It is important for InP lasers that the ridges are aligned parallel to the major flat (crystal planes) of the wafer. It will be understood that all wafers have the crystal axes identified by the roundness being flattened, which is what is meant by the term crystal flat.

Accordingly, it would be beneficial if a "ridge" laser could be designed having single frequency performance similar to that available using direct write electron beam lithography but which could be manufactured using conventional optical lithography techniques.

A further important alignment is in the referencing between a topographic feature for example a slot in a waveguide, and the laser facet. The laser facet is the break in the laser which is along a crystal axis and which is the mirror providing feedback into the laser. The position of the laser facet is defined by the cleave feature as shown in FIG. 7. The reflectivity of the facet may be changed by the application of coatings. It is advantageous to have this referencing as accurate as possible for best reproducibility in device performance. The cleave feature is a notch formed by etching. FIG. 7 illustrates that the ridge is the only structure extending above the etched surface and that the cleave feature starts at the etched level. It will be appreciated that conventionally, whilst areas adjacent to the ridge may be etched, other regions of the semiconductor structure may be of similar height to the ridge. In these situations the cleave feature will extend from the top layer through to the substrate. In the direct write electron beam process prior art the cleave feature is formed in a different step of the process to the ridge and slot. Alignment of the slot and cleave feature is achieved by the resolution available through electron beam lithography.

It would further be beneficial if conventional optical lithography manufacturing processes could be modified to allow in manufacture registration or alignment of slots or other topographic features to the cleaving feature and hence facet of a opto-electronic device, for example a laser.

Accordingly, there is a need for an improved semiconductor device, e.g. ridge laser and method of making same.

SUMMARY OF THE INVENTION

This need and others are satisfied by the present invention, in which a first embodiment of the invention provides a semicoductor device for example an opto electronic laser device formed on a substrate having a plurality of layers with a topographical feature, for example a ridge established by the removal of sections of at least one of the layers, the ridge comprising at least one elongate section having at least one associated defect defining region, the at least one defect defining region defining a defect in the topographical feature, wherein the width of the topographical feature is greater in the at least one defect defining region than in adjacent regions of the at least one elongate section.

It will be understood by those skilled in the art that in the context of the present invention a defect is an element which effects a change in the reflective index or gain of a structure, feature or waveguide.

Each defect defining region may comprise at least one side portion extending perpendicular to the longitudinal axis of the elongate body portion. Preferably, each defect defining region has two side portions extending in opposite directions from the elongate body portion The topographical feature may comprise at least one pair of opposing T-shaped ridge sections disposed along a longitudinal axis.

In one embodiment, the topographical feature is a ridge. In a preferred variation, the defect comprises an aperture formed in the ridge. In this preferred embodiment, the height of the ridge may be substantially the same as the depth of the aperture defined in the defect defining region. This provides the advantage of manufacturing the ridge and aperture in the same step. Alternatively, the depth of the aperture defined in the defect defining region is different to the height of the ridge and is preferably less than the height of the ridge. This provides the advantage of allowing independent control of wavelength (slots) and spatial mode (ridge).

In an alternative variation, the defect is formed by Ion Implantation. In a further alternative variation, the defect is formed using an Impurity Induced Layer disorder. Using the extra width in the associated defect defining region prevents damage to the junction region of laser devices in the vicinity of the defect.

In a second embodiment, a semiconductor device, for example a laser, is provided, the device comprising at least one ridge formed on a substrate, the at least one ridge laser comprising at least one pair of opposing T-shaped ridge sections disposed along a longitudinal axis. Each opposing pair of T-shaped ridge sections are preferably substantially separated by an associated defect region, for example a suitably formed aperture in the ridge. The device may comprise a plurality of ridges formed on the same substrate. Optionally, each of the ridges, for example which may be ridge lasers, may be designed by careful selection of defect positioning and/or size, to provide different characteristics, e.g. wavelength, for each of the ridges of devices. The invention also extends to a optical, for example laser system, comprising the devices described having a plurality of ridges, each ridge being optically coupled to an associated light guide, or an optical multiplexer coupled to the associated light guides and adapted to receive the light outputs from each of the ridges and to combine the light outputs to provide a single light output. In a preferred variation, each ridge forms an associated ridge laser.

According to a third embodiment of the invention, a method of manufacturing an optoelectronic device, for example a ridge laser having one or more defect regions on a semiconductor body comprising a semiconductor substrate having a plurality of layers disposed thereon, the method comprising the steps of:

performing a first etching to substantially define a ridge on the semiconductor body, using a second etching to provide independent control of the defect depth with respect to the ridge height.

In one variation of this third embodiment, the first etching forms an elongate ridge of substantially uniform height above the etched surface of the semiconductor body and the second etching forms an aperture in the elongate ridge.

In an alternative variation, the first etching forms an elongate ridge of substantially uniform height above the etched surface and having an aperture defined therein, and wherein the second etching increases the height of the ridge relative to the aperture depth. The layers may be epitaxial layers In a further embodiment of the invention a method is provided for manufacturing a semiconductor device for example a laser, from a semiconductor body comprising a semiconductor substrate having a plurality of layers disposed thereon comprising the steps of:

forming a first resist layer on the surface of the semiconductor body, the first resist layer defining the upper surface of an elongate ridge portion having a uniform width, performing a first etching of the semiconductor body to form an elongate ridge of uniform height above the etched surface of the semiconductor body, forming a second resist layer on the surface of the semiconductor body, the second resist layer defining the surface outline of a slot in the elongate ridge, and performing a second etching of the semiconductor body to form an aperture in the elongate ridge. Preferably, the aperture is in the form of a slot transverse to the longitudinal axis of the ridge. The second etching may be such that the depth of slot formed may differ from the height of the elongate ridge. The first resist layer in defining the elongate ridge portion includes at least one side portion extending perpendicular to the longitudinal axis of the ridge adjacent to the slot formed in the ridge. The step of forming a second resist layer preferably utilises a mask that defines an etching region narrower than the width of the elongate portion of the ridge.

The invention also provides a method of manufacturing a semiconductor laser from a semiconductor body having a semiconductor substrate having a plurality of, for example epitaxial layers disposed thereon comprising the intermediate step of:

forming a resist layer on the surface of the semiconductor body, the resist layer defining a surface ridge portion having at least one associated defect surface portion, the defect surface portion having at least one side surface portion extending perpendicular to the longitudinal axis of the elongate surface ridge portion, performing an etching of the semiconductor body to form a ridge having an elongate portion and at least one defect portion, the defect portion having at least one side portion extending perpendicular to the longitudinal axis of the elongate ridge portion. The defect portion may have an aperture formed therein.

The invention further provides a method of aligning between lithographic levels of a semiconductor body comprising the steps of:

forming a topographical outline, for example of a waveguide in the form of a ridge, having at least one defect region defined therein and the outline of a cleave marking region in a first layer of resist material on the surface of the semiconductor body, performing one or more processes to form the topographical feature and a cleave marking notch from the topographical outline, forming the outline of a second cleave marking region in a second layer of resist material on the surface of the semiconductor body, where the second cleave marking region substantially overlaps the notch formed in the cleave marking region, performing a second etching into the active layers of the semiconductor, performing a third etching using a crystallographic etches as to form a self-aligned feature.

Further objects, features and advantages of the present invention will become apparent from the following description and drawings.

BRIEF DESCRIPTION OF THE DRAWINGS

The invention will now be described in more detail having regard to the accompanying drawings in which.

DETAILED DESCRIPTION OF THE DRAWINGS

FIGS. 1 to 8 have been discussed with reference to the prior art in the section "Background to the Invention".

Figure 9A:
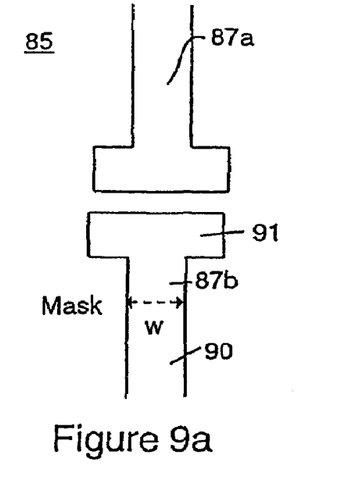
FIG. 9 is a representation of a mask and resist feature according to an embodiment of the present invention.

FIG. 9a represents an exemplary lithographic mask 85 according to the invention for the production of a topographical outline, in the present example a ridge surface outline 86, in a masking layer, for example of resist material, on a semiconductor structure using conventional lithography. The lithographic mask 85 may be made in accordance with conventional techniques, such as using electron beams to define a pattern in chrome on glass or quartz. It is advantageous to use the highest possible resolution in the manufacture of the mask. The mask comprises an opposing pair of 'T' shaped regions 87a, 87b, each 'T' shaped surface region 87a, 87b having an elongate section 90 and a defect defining region 91. The defect defining region 91 of FIG. 9a is identifiable as the transverse bar section of the 'T' shape. A gap if formed in the mask between the defect defining regions of the opposing 'T' shaped regions. The width of the ridge outline (w) the present example is substantially constant along the elongate section 90 of the 'T' shaped regions of the mask. The mask is wider in the defect defining regions 91 of the mask than adjacent regions of the mask. It will be appreciated that the length of the elongate section need not be substantially constant. The defect defining region 91 is wider because of side portions extending perpendicular to the elongate sections. In practise, more than one pair of opposing 'T' shaped sections may be provided in each ridge outline.

Differing from the prior art, the present invention provides a substantially non-linear mask, such that at the position where a slot (defect) is required in the ridge the mask includes features that extend transversely from the longitudinal axis of the ridge. As described previously, corner regions have the most detrimental effect on pattern transfer. The corners of the mask of the present invention are offset to either side of the longitudinal axis of the ridge mark (elongate portion) with the effect that the resultant corners of the slot (defect) formed in the ridge are moved away from the critical gap region, leading to a more reliable and reproducible pattern transfer in the critical guiding region.

Figure 9B:
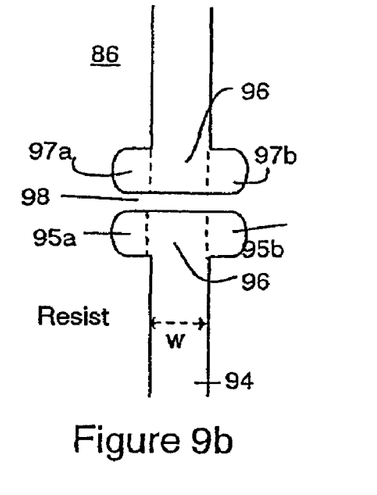

The resulting resist layer 86, illustrated in FIG. 9b, formed on a semiconductor body using the mask 85 and conventional optical lithography techniques demonstrates rounding effects. However the rounding effects are located in the side portions 95a, 95b, 97a, 97b of the defect defining region and away from the elongate portion 94 of the ridge and the critical region 96 of the gap 98 formed between the two opposing 'T' shaped ridge patterns.

Figure 10:
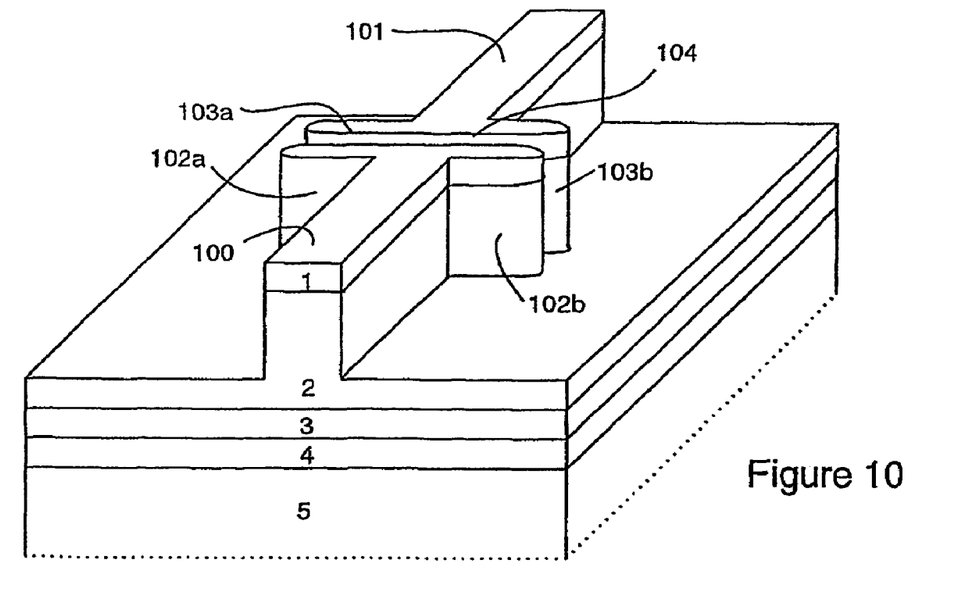
FIG. 10 is a pictorial representation of a ridge laser according to the present invention.

The resulting topographical feature, i.e. the ridge, formed by an etching process is shown in FIG. 10, in which the rounding effects from the resist pattern have been reproduced in the side portions of the defect defining regions of the ridge. However, it is clear that the opposing surfaces of the T shaped sections 100, 101 of the ridge do not demonstrate rounding in the critical region of the ridge adjacent to the slot 104 formed between the two opposing 'T' shapes. Thus the rounding effect has been moved away from the critical region of the ridge and into the side portions 102a, 102b, 103a, 103b. The width and depth of the side portions should be selected such that there is no mode conversion and that excessive current spreading does not occur. It will be appreciated that the primary purpose of the side portions is to remove rounding effects from the critical central section of the elongate structure of the ridge. In the example shown, the slot effectively separates the two opposing 'T' sections. It is however, sufficient that an aperture be provided to separate opposing critical regions of the 'T' sections. While the example illustrated is for a T shape, it will be appreciated by those skilled in the art that any other configuration which moves the corners away from the critical region without necessarily changing the essential width of the elongate section of the ridge will be equally applicable.

As would be expected, in the example shown, the ridge formed is of uniform height and the depth of the slot equals the height of the ridge.

The use of a wider defect region than the elongate portions of the topographical feature, e.g. a ridge laser, may also be beneficial in other processes where the defect is formed using a method other than the etching process described.

For example, if the defect is formed using a Selective Ion Implantation technique, in which the area where a defect is required is selectively bombarded with hydrogen ions. This bombardment of hydrogen ions alters the refractive index of the material in the defect region thus introducing a defect. In this case, the extra width of the ridge in the region of the defect prevents accidental damage to the underlying layers in the region of the defect. In the absence of this extra width, spillover of hydrogen ions from the defect area could enter underlying layers in the area adjacent to the defect region ridge and alter the characteristics of the underlying areas, which could affect the performance of the laser.

For similar reasons, the use of defect defining region which is wider than the elongate sections of the ridge may have advantages in other processing techniques used to form the defects, e.g. Impurity Induced Layer Disorder Techniques (IILD), which use localised heating to create a defect.

A further aspect of the invention provides a process for the production of semiconductor devices, for example lasers, and for the forming of a cleave feature in the semiconductor body. This technique relies on the availability of selective etchants for the different layers that comprise the epitaxial material. The example which follows relates to Indium Phosphide (InP) based lasers where typically an InGaAs(P) active layer system is sandwiched between InP n- and p-doped layers on an n-type InP substrate. It will be appreciated that the layers and device described herein are illustrative only, and it is not intended to limit the application of the present invention to such specifics. For example, the 'active' region may consist of 10's of individual layers, comprised for example of quantum wells. Semi-insulating substrates could also be used, as could "p type" substrates, but as is known within the art "p type" substrates are not of as high a quality. Similarly, the technique may be used for other optoelectronic devices.

Figure 11:
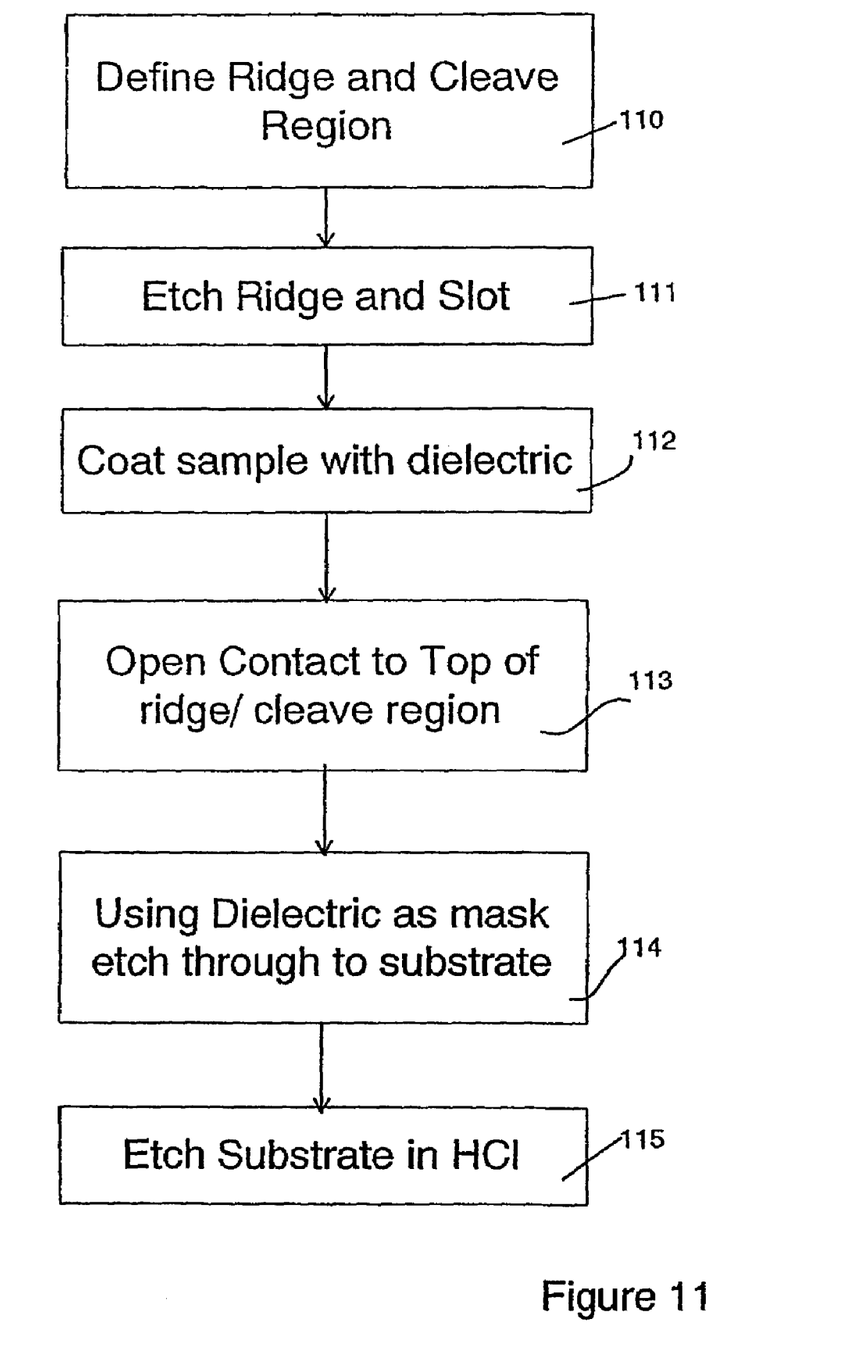
FIG. 11 is a process according to the invention.
Figure 12A:
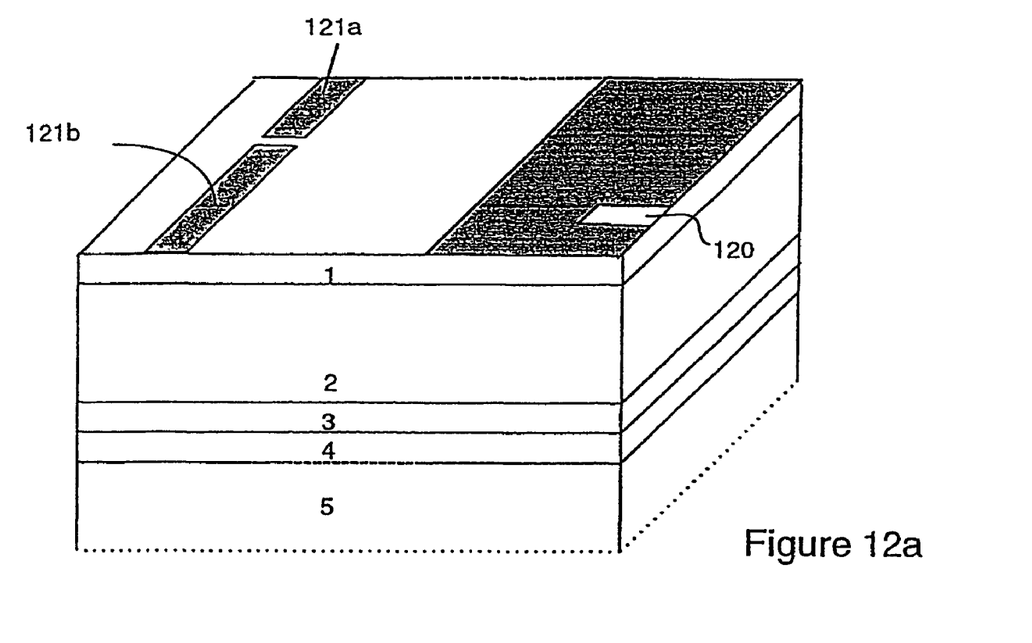
FIG. 12 illustrates some of the steps of the process of FIG. 11.

The process, shown in FIG. 11, commences with the formation 110 of a cleave marking region 120 in area of resist material at the same time as marking a topograhical feature, i.e. the ridge pattern 121a, 121b in the resist material as shown in FIG. 12a (the resist material is the shaded area).

Figure 12B:
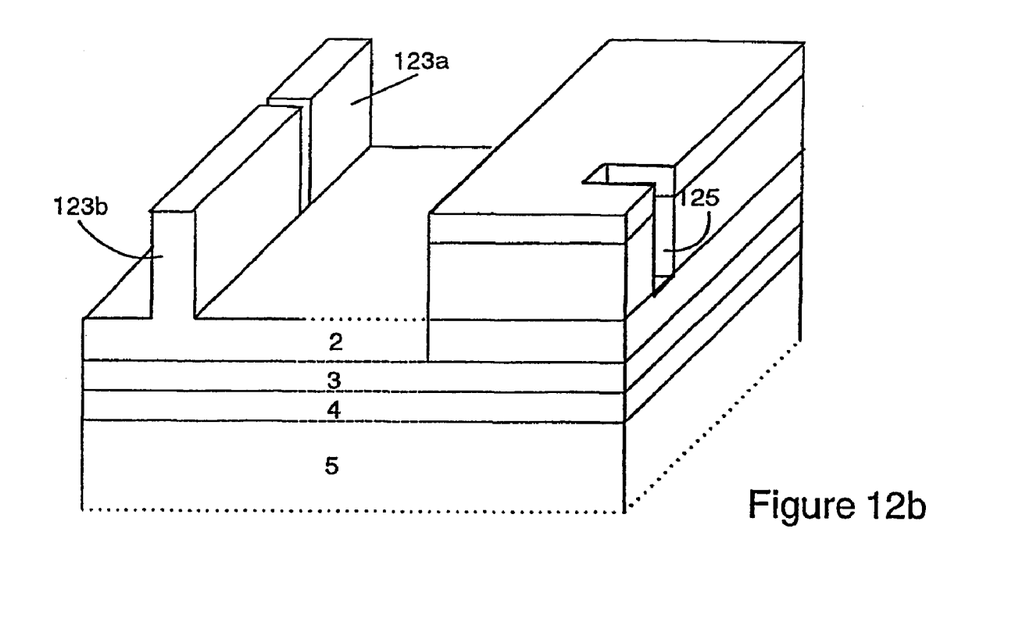

The next step 111 is to use an etching process to form the ridge sections 123a, 123b which are separated by a defect regions (slot) as shown in FIG. 12b. The etching also forms a cleave marking notch 125. This first etching process may for example be a non-selective plasma etch to etch into the InP upper cladding layer (layer 2). It will be appreciated that any etch which allows the preservation of the pattern is equally applicable, for example a methane and hydrogen reactive ion etch (RIE) may be used for InP based materials, whereas other plasmas may be more applicable for GaAs materials. As an alternative to using a single etching process to form the topographical feature (i.e. the ridge and slot) and cleave marking notch, the layer of resist material forming the cleave marking region and the topographical feature may be used as a guide for subsequent processes. Thus for example it is conceivable that the etching process (111) is replaced by two distinct process, the first operating on the cleave marking region with a second process operating on the ridge region. The important factor is that the topographical feature and cleave features are outlined in the same process and are thus registered with respect to one and other.

The next stage 112 in the process is the application of a layer of dielectric material. The next step 113 involves opening the top of the ridge and the cleave region 120 using a suitable technique. This step may also open the region adjacent to the notch. Accordingly, a layer of dielectric material is absent at and adjacent to the cleave marking notch.

A subsequent non selective dry etch step is performed to etch 114 through the InGaAs(P) active layers, but because of the dielectric this is confined to regions adjacent to the notch, i.e. the dielectric acts as a resist layer. The effect of the second etching process is to form a tiered notch, the lower tier having been formed by the action of the first and second etching processes with the upper tier formed by the second etching process. The lower tier extends into the substrate, whereas the upper tier remains in the epitaxial layers. The final step 115 in the process is a crystallographic etch for InP, which will define a cleave feature, by finding a crystal axis. In certain circumstances, the use of a crystallographic etch on its own may be sufficient and the second etching process could be omitted. As the initial cleave marking resist region was formed using the same mask as was used for forming the slot in the ridge, it will be clear that the resulting cleave feature will be self aligned with the slot. Accordingly, as the cleave feature is formed within the marking notch, it is clear that it will be aligned with the slots in the ridges formed on the semiconductor body. Thus this second aspect of the invention provides for accurate facet or length positioning of topographic features such as a slot with respect to the overall length of a semiconductor or laser device, along the ridge of a ridge laser device.

The invention also provides a method to independently control the spatial and spectral behaviour of the laser, with additional steps it may also be used to improve the length definition. One problem with current methodologies is that the etch depth for the slot must be chosen to be the same as the structure defining the spatial mode. This means that there is not true independent control between the spatial and spectral performance. A large ridge is required to maintain spatial mode performance, while large slot depths can lead to gain loss. Therefore independent control of the ridge depth is required to optimise laser performance. Accordingly, s laser performance is currently compromised.

Figure 13:
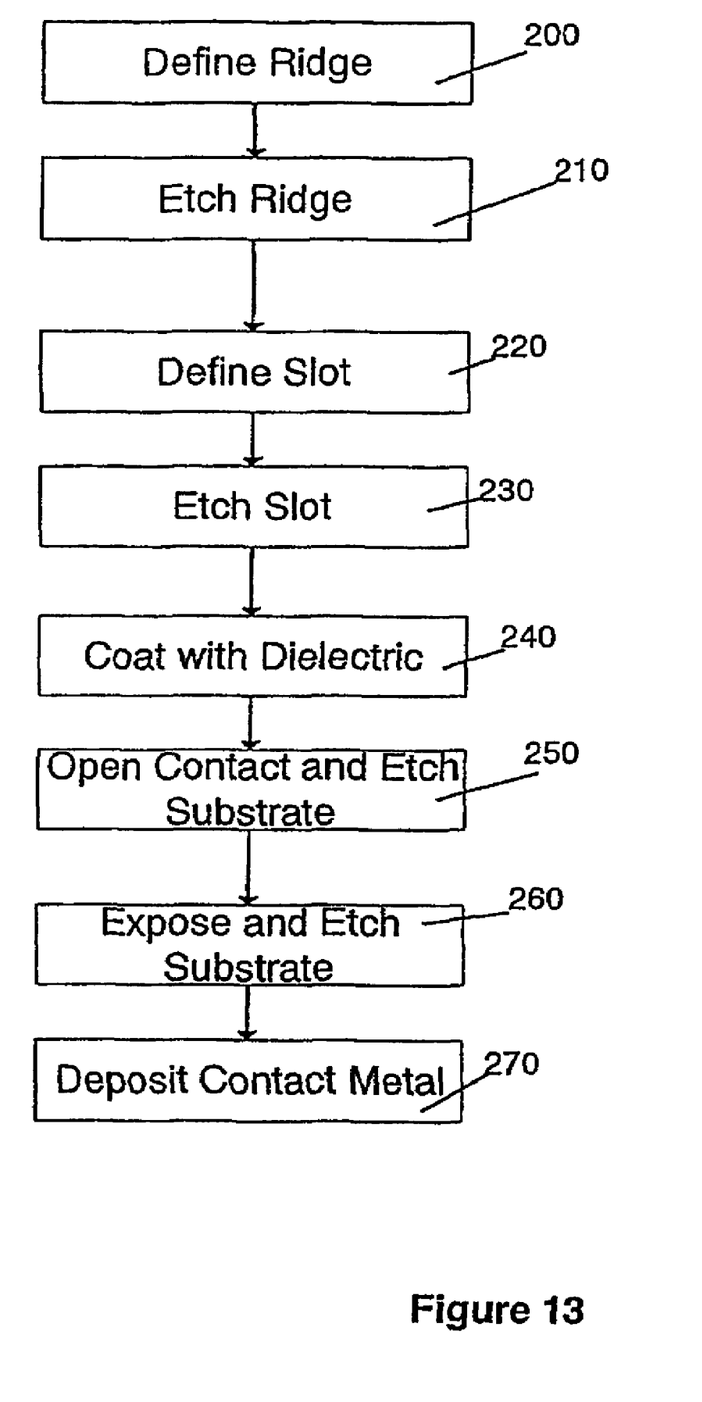
FIG. 13 is a further process according to the invention.
Figure 14A:
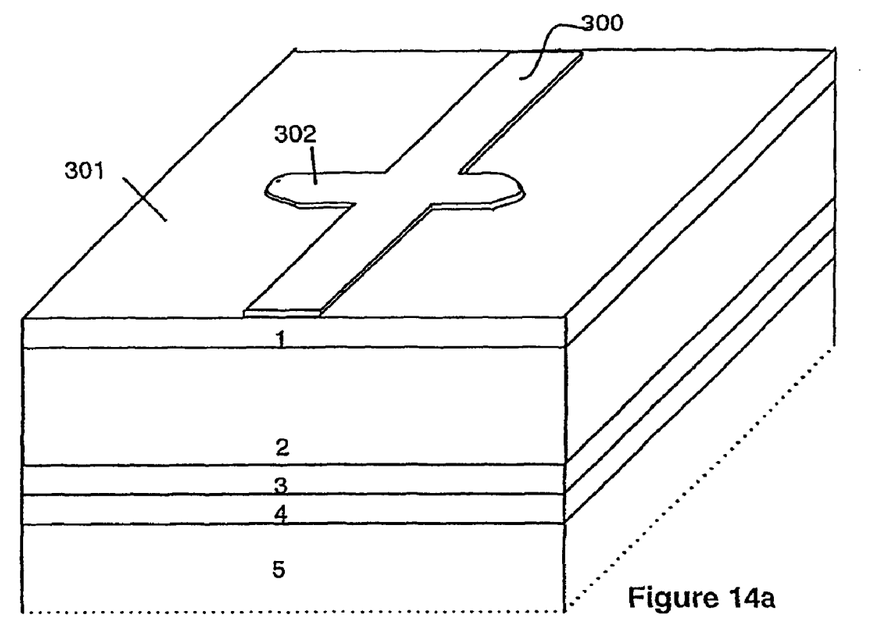
FIG. 14 is a pictorial representation of a semiconductor structure at different stages of the process shown in FIG. 13.
Figure 14C:
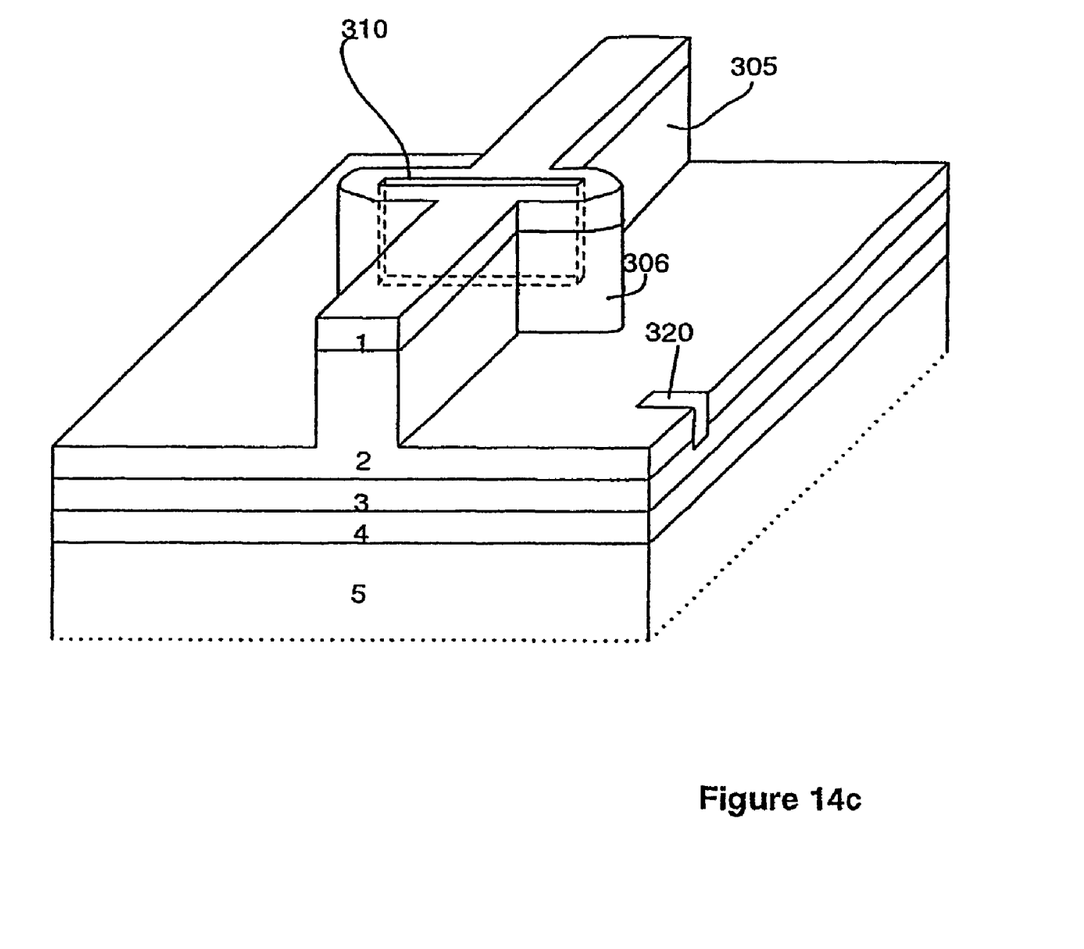

A manufacturing process to independently control these aspects is shown in FIG. 13 with FIG. 14 reflecting the outcome of each step of the process. By incorporating some steps for the cleaving feature, the method also simplifies the process for registration (fixing the distance) between the defect (slot) and the cleave feature (and hence the facet). Although, it will be appreciated that these steps are not essential to achieve independent control of the spatial and spectral behaviour of the waveguide (laser). The first step (200) comprises the definition of a ridge 300 in a resist material layer placed on the top surface 301 of the epitaxial layers of the wafer, and the definition of a defect region 302 in the ridge, the defect region being an area defining ridge section substantially wider than the normal width of the ridge. The resulting resist pattern is shown in FIG. 12a.

The next step (210) is establishing a ridge structure by etching. The ridge may be formed by wet or dry etching or a combination of both. By using dry etching for most of the etch sequence, it is easier to preserve the pattern. However, a final wet etch in conjunction with an epitaxially grown etch stop layer allows very accurate depth definition. The use of the etch stop layers in the epitaxial structure effects a precise epitaxially defined definition of the ridge 305 and defect region 306.

The next step (220) is to form the outline of a defect (slot) feature in the layer of resist material covering the structure using a suitable mask and lithographic process. Simultaneously, a cleave marking feature may be formed in the layer of resist material.

As the slot depth is obtained in a separate step to that step which defines the height of the ridge, independent control of the spectral and spatial features of the laser device may readily be achieved, with the ridge height providing control of the spatial mode of the laser and the slot depth providing control of the wavelength performance of the laser.

The subsequent step 230 is an etching process that forms a slot 310 in the defect region 306 to the desired depth. At the same time an opening for the cleave feature 320 is formed. As the opening for the cleave feature and slot are formed using the same mask, accurate reproduction of facet/slot distances may be achieved. Following a masking of the structure in a dielectric material the formation of the cleave feature is continued using a further etching process for example using dry etching through the active layers to the substrate so as to expose the InP substrate, which is then HCl etched.

The remaining steps in the process are standard and have been described previously.

The process flow of FIG. 13 is advantageous in that it eases the requirements on lithography and effects superior lasers. It will be appreciated that Steps 200–230 are applicable to all types of lasers and that the specific compounds referred to in the definition of the cleave mark are specific to InP-type lasers. It will also be appreciated that the process steps described for ridges and slots are equally applicable for any general topographic feature or means of effecting index or gain changes. It will be furthermore appreciated that the process described for ridge waveguides may also be applied with minor modification to other, more general, semiconductor structures.

An alternative technique to the method steps 200 to 230 of FIG. 13, is provided in FIG. 14. Although, the process of FIG. 13 provides significant advantages in the manufacture of laser devices. It may in practise be difficult to accurately control the depth of the slot in the second etching process. This is because when attempting to observe the depth of the slot, it has been found that the slot is obscured by the surrounding material in the defect region.

Figure 15:
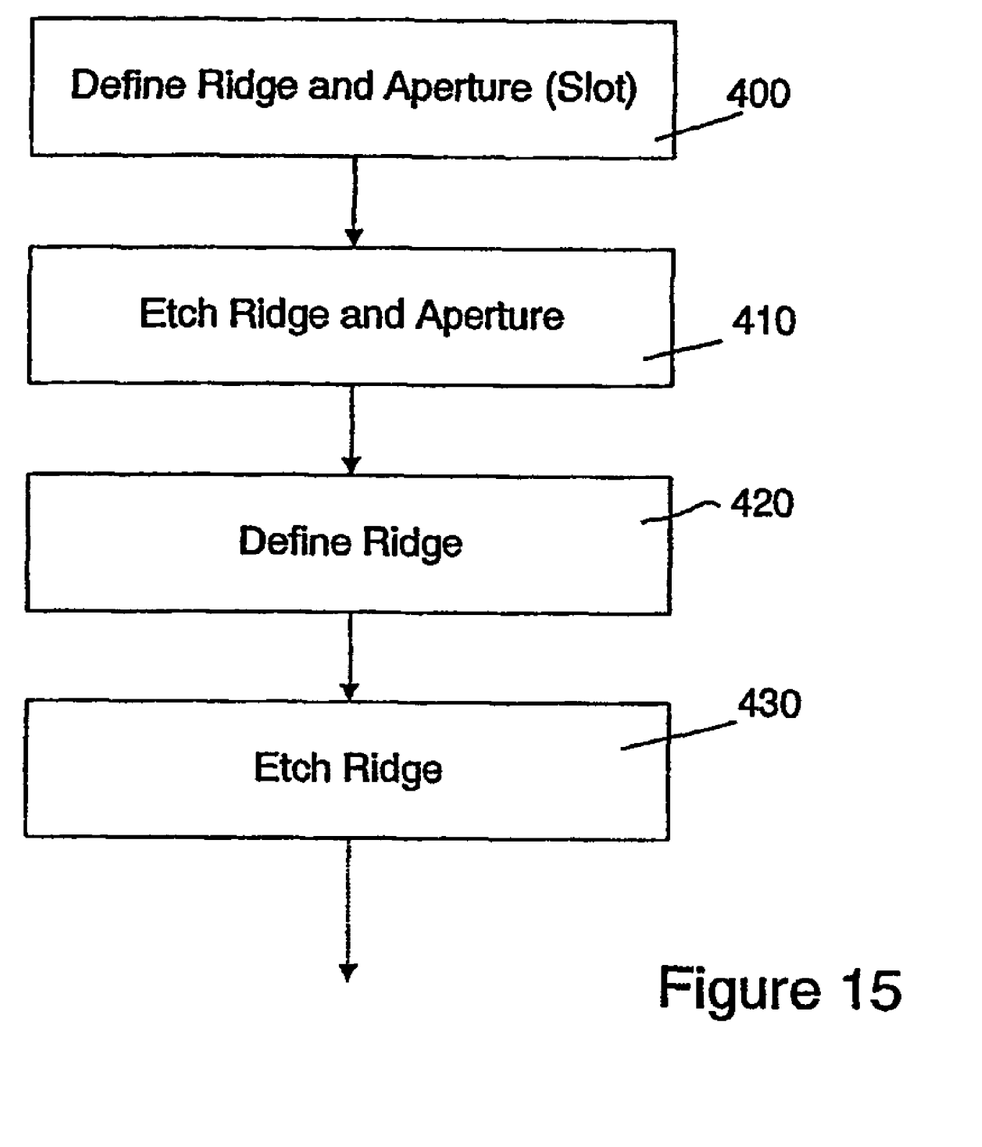
FIG. 15 is a further process according to the invention.

The method of FIG. 15, commences with the step (400), which comprises the definition of the ridge in the resist material layer placed on the top surface of the epitaxial layers of the wafer as before. The step (400) also provides the definition of a defect region in the ridge, the defect region being an area defining ridge section substantially wider than the normal width of the ridge. At the same time a gap is left in the resist material in the defect region. This gap will form an aperture in the defect region when etched.

The next step (410) is the establishing of the ridge structure by etching. However, unlike the previous etching step associated with FIG. 13, the height of the established ridge is less than its final value. Moreover, the height of the ridge established equates to the final depth of the aperture in the defect region, which was also formed during this etching step. The use of the etch stop layers in the epitaxial structure may be used to effect a precise epitaxially defined definition for the depth of the slot (initial height of the ridge).

The next step (420) is to form the definition of the ridge in a further layer of resist material layer placed on the top surface of the epitaxial layers of the wafer. The aperture in the defect region is however omitted from the definition.

A further etching step (430) is then performed, this etching step increases the height of the ridge, but leaves the depth of the aperture in the defect region unaltered. The use of the etch stop layers in the epitaxial structure may be used to effect a definition for the final height of the ridge. The remaining steps of the process follow the previous method of FIG. 13. For ease of explanation, references to forming the cleave feature have been omitted.

As the slot depth is obtained in a separate step to that step which defines the height of the ridge, independent control of the spectral and spatial features of the laser device may readily be achieved, with the ridge height providing control of the spatial mode of the laser and the slot depth providing control of the wavelength performance of the laser. It will be appreciated that in the method of FIG. 15, the final slot depth will always be less than the height of the ridge. It will further be appreciated that the methods of FIG. 13 and FIG. 15, provide independent control of the aperture (slot) depth and the ridge height.

The present invention offers many advantages over prior techniques in that it provides a method of using projection (optical) lithography systems. Harmonic mode locking can be generated through the addition of saturable absorbing regions within a laser cavity containing sub-cavities defined by the slots.

The words "comprises/comprising" and the words "having/including" when used herein with reference to the present invention are used to specify the presence of stated features, integers, steps or components but does not preclude the presence or addition of one or more other features, integers, steps, components or groups thereof.

The invention claimed is:

1. A method of manufacturing a semiconductor device from a substrate having a plurality of layers, comprising the steps of:
    selectively removing sections of at least one of the layers to form at least one waveguide comprising at least one elongate section having at least one defect defining region, and
    forming an associated defect in the at least one defect defining region of the waveguide,
    wherein the waveguide comprises a pair of opposing T-shaped ridge sections, each T-shaped ridge section comprising an elongate section and a transverse bar section, and the transverse bar sections of the T-shaped ridge sections are formed adjacent to or integrally with one another to form said defect defining region such that the width of the waveguide is greater in the at least one defect defining region of the waveguide than in at least one adjoining section of the waveguide.

2. A method of manufacturing a semiconductor device according to claim 1, wherein the associated defect is formed by an etching process, for example as an aperture in the waveguide.

3. A method of manufacturing a semiconductor device according to claim 1, wherein the associated defect is formed by selective Ion Implantation.

4. A method of manufacturing a semiconductor device according to claim 1, wherein the associated defect is formed by selective use of an Impurity Induced Layer Disorder (IILD) technique in the defect region.

5. A method of manufacturing a waveguide defined by a ridge structure having at least one defect defining region with at least one etched defect defined therein, the etched defect having a defect depth, on a semiconductor body comprising a semiconductor substrate having a plurality of layers disposed thereon, the method comprising the steps of:
    performing a first etching to substantially define a waveguide having a ridge height on the semiconductor body,
    using a second etching to provide independent control of the defect depth with respect to the ridge height.

6. A method according to claim 5, wherein the first etching forms an elongate waveguide above the etched surface of the semiconductor body and the second etching forms the defect in the form of an aperture in the elongate waveguide.

7. A method according to claim 5, wherein the first etching forms an elongate waveguide above the etched surface and having a defect in the form of an aperture defined therein, and wherein the second etching is used to increase the ridge height of the waveguide relative to the depth of the defect.

8. A method according to claim 5, wherein the waveguide is wider at the defect defining regions than in the non defect defining regions.

9. A method of manufacturing a semiconductor laser from a semiconductor body having a semiconductor substrate having a plurality of layers disposed thereon comprising the intermediate steps of:
    forming a resist layer on the surface of the semiconductor body, the resist layer defining an elongate surface ridge portion having at least one defect surface portion, the defect surface portion having a pair of side surface portions extending perpendicular to the longitudinal axis of the elongate surface ridge portion, performing an etching of the semiconductor body to form a ridge having an elongate portion and at least one defect portion, the defect portion having a pair of side portions extending perpendicular to the longitudinal axis of the elongate ridge portion, such that the ridge comprises a pair of opposing T-shaped ridge sections, each T-shaped ridge section comprising an elongate portion and a transverse bar portion, and the transverse bar portions of the T-shaped ridge sections are formed adjacent to or integrally with one another to form said defect portion.

10. A method of manufacturing a semiconductor laser according to claim 9, wherein the defect portion is selectively exposed to Ion Implantation so as to create a defect in the ridge.

11. A method of manufacturing a semiconductor laser according to claim 9, wherein a defect is formed in defect portion using an Impurity Induced Layer Disorder (IILD) technique.

12. A method of manufacturing a semiconductor laser according to claim 9, wherein the defect portion comprises a defect in the form of an aperture formed by an etching process.

13. A method of manufacturing a semiconductor body comprising the steps of:
  forming a topographical feature and the outline of a cleave marking region in a first layer of masking material on the surface of the semiconductor body,
  performing one or more processes to form the topographical feature from the topographical outline and a cleave marking notch from the outline of a cleave marking region,
  forming the outline of a second cleave marking region in a second layer of masking material on the surface of the semiconductor body, wherein the second cleave marking region overlaps the notch formed in the cleave marking region, and using a crystallographic etch to form a cleaving feature in the notch so as the cleaving feature is substantially aligned with the topographical feature.

14. A method according to claim 13, wherein the step of performing one or more processes to form the topographical feature and a cleave marking notch from the topographical outline comprises a single etching process.

15. A method according to claim 13, wherein an etching step is performed between the step of forming the outline in the second layer of masking material and the step of using a crystallographic etch.

16. A method according to claim 13, wherein the topographical feature is a ridge having an associated defect.

17. A method according to claim 13, wherein the defect is a slot, gain changing means or refractive index changing means.

18. A method according to claim 13, wherein the cleaving feature is aligned with respect to the associated defect.

19. A method according to claim 13, further comprising the step of cleaving the semiconductor body at the cleaving feature.

* * * * *

UNITED STATES PATENT AND TRADEMARK OFFICE
CERTIFICATE OF CORRECTION

PATENT NO. : 7,087,448 B2  Page 1 of 1
APPLICATION NO. : 10/399070
DATED : August 8, 2006
INVENTOR(S) : Brian Michael Corbett It is certified that error appears in the above-identified patent and that said Letters Patent is hereby corrected as shown below:

On Title Page item 73
Assignee name on said Letters Patent should not be "University of Ireland, Cork." should be --National University of Ireland, Cork.--

Signed and Sealed this

Twenty-eighth Day of August, 2007

JON W. DUDAS
*Director of the United States Patent and Trademark Office*